(12) United States Patent
Kuzushita et al.

(10) Patent No.: US 9,455,682 B2
(45) Date of Patent: Sep. 27, 2016

(54) ELASTIC WAVE FILTER DEVICE AND DUPLEXER

(71) Applicant: Murata Manufacturing Co., Ltd., Nagaokakyo-shi, Kyoto-fu (JP)

(72) Inventors: Takuma Kuzushita, Nagaokakyo (JP); Yasumasa Taniguchi, Nagaokakyo (JP); Takashi Miyake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 63 days.

(21) Appl. No.: 14/615,503

(22) Filed: Feb. 6, 2015

(65) Prior Publication Data

US 2015/0155850 A1    Jun. 4, 2015

Related U.S. Application Data

(63) Continuation of application No. PCT/JP2013/072733, filed on Aug. 26, 2013.

(30) Foreign Application Priority Data

Aug. 30, 2012  (JP) ................. 2012-189805

(51) Int. Cl.
*H03H 9/72* (2006.01)
*H03H 9/64* (2006.01)
(Continued)

(52) U.S. Cl.
CPC ......... *H03H 9/0576* (2013.01); *H03H 9/0566* (2013.01); *H03H 9/24* (2013.01);
(Continued)

(58) Field of Classification Search
CPC ............. H03H 9/0566; H03H 9/0571; H03H 9/0576; H03H 9/02913; H03H 9/24; H03H 9/25; H03H 9/542; H03H 9/568; H03H 9/605; H03H 9/706; H03H 9/725; H03H 9/6483; H03H 7/463; H03H 200/0085
USPC .......................................... 333/133, 193–195
See application file for complete search history.

(56) References Cited

U.S. PATENT DOCUMENTS

| 6,750,737 B2 * | 6/2004 | Uriu ...................... H03H 7/46 333/133 |
| 7,183,878 B2 * | 2/2007 | Kushitani ............ H03H 9/0576 333/133 |

(Continued)

FOREIGN PATENT DOCUMENTS

| CN | 102057571 A | 5/2011 |
| JP | 2009-290606 A | 12/2009 |

(Continued)

OTHER PUBLICATIONS

Official Communication issued in International Patent Application No. PCT/JP2013/072733, mailed on Nov. 5, 2013.

*Primary Examiner* — Barbara Summons
(74) *Attorney, Agent, or Firm* — Keating & Bennett, LLP (57) ABSTRACT

In an elastic wave filter device, an elastic wave filter element chip is mounted on a board. In the elastic wave filter element chip, a ladder filter including a plurality of series arm resonators and a plurality of parallel arm resonators are provided. In/on the board, a first inductor connected in parallel to the series arm resonator and a second inductor connected between the parallel arm resonators P1-P3 and a ground potential are provided. In/on the board, a shield electrode is located between the first inductor and the second inductor.

14 Claims, 5 Drawing Sheets

(51) Int. Cl.

| | | |
|---|---|---|
| *H03H 9/05* | (2006.01) | |
| *H03H 9/54* | (2006.01) | |
| *H03H 9/70* | (2006.01) | |
| *H03H 9/24* | (2006.01) | |
| *H03H 9/25* | (2006.01) | |
| *H03H 9/56* | (2006.01) | |
| *H03H 9/60* | (2006.01) | |
| *H03H 7/46* | (2006.01) | |
| *H03H 1/00* | (2006.01) | |

(52) U.S. Cl.
CPC .............. *H03H 9/25* (2013.01); *H03H 9/542* (2013.01); *H03H 9/568* (2013.01); *H03H 9/605* (2013.01); *H03H 9/6483* (2013.01); *H03H 9/706* (2013.01); *H03H 9/725* (2013.01); *H03H 7/463* (2013.01); *H03H 2001/0085* (2013.01)

(56) References Cited

U.S. PATENT DOCUMENTS

| | | | |
|---|---|---|---|
| 2007/0030096 A1* | 2/2007 | Nishihara | .............. H03H 9/605 333/133 |
| 2009/0058555 A1 | 3/2009 | Takata et al. | |
| 2009/0322444 A1 | 12/2009 | Tanaka | |
| 2010/0066461 A1 | 3/2010 | Yonekura | |
| 2010/0109802 A1 | 5/2010 | Tanaka | |
| 2011/0095845 A1 | 4/2011 | Fujiwara et al. | |
| 2012/0176206 A1 | 7/2012 | Inoue et al. | |
| 2012/0235767 A1 | 9/2012 | Takata et al. | |
| 2012/0313726 A1 | 12/2012 | Ueda et al. | |
| 2013/0321102 A1* | 12/2013 | Iwaki | ...................... H03H 1/00 333/193 |

FOREIGN PATENT DOCUMENTS

| | | |
|---|---|---|
| JP | 2010-011300 A | 1/2010 |
| JP | 2010-109694 A | 5/2010 |
| JP | 2010-245722 A | 10/2010 |
| JP | 2011-071874 A | 4/2011 |
| JP | 2011-176746 A | 9/2011 |
| WO | 2007/145049 A1 | 12/2007 |
| WO | 2008/029641 A1 | 3/2008 |
| WO | 2008/146525 A1 | 12/2008 |
| WO | 2011/077773 A1 | 6/2011 |
| WO | 2011/089746 A1 | 7/2011 |

* cited by examiner

ELASTIC WAVE FILTER DEVICE AND DUPLEXER

BACKGROUND OF THE INVENTION

1. Field of the Invention

The present invention relates to elastic wave filter devices having ladder circuit configurations, and more specifically, elastic wave filter devices in which elastic wave filter chips are mounted on boards.

2. Description of the Related Art

Conventionally, elastic wave filters having ladder circuit configurations have been widely used as transmission filters of duplexers in cellular phones. For example, the following Japanese Unexamined Patent Application Publication No. 2010-109694 discloses a duplexer including a transmission filter composed of an elastic wave filter having a ladder circuit configuration and a reception filter composed of a longitudinally coupled resonator-type elastic wave filter.

In the transmission filter of duplexer described in the Japanese Unexamined Patent Application Publication No. 2010-109694, a plurality of series arm resonators is formed in a series arm. A bridging inductance is connected in parallel to one of the series arm resonators on a transmitter terminal side. Further, in parallel arms connecting the series arm and a ground potential, a parallel arm inductance is connected in between a parallel arm resonator and the ground potential. In practice, an elastic wave filter chip with the ladder circuit configuration is mounted on a board. In the elastic wave filter chip, a plurality of series arm resonators and a plurality of parallel arm resonators are connected so as to form the ladder circuit configuration.

Further, the bridging inductance and the parallel arm inductance described above are formed on the board.

In the configuration described in the Japanese Unexamined Patent Application Publication No. 2010-109694, there is a problem that attenuation at a stopband near a passband of the elastic wave filter, namely, a stopband near a transmission band is not large enough. Further, in the duplexer, isolation at a passband, namely, a reception band of the reception filter is not sufficient.

SUMMARY OF THE INVENTION

Preferred embodiments of the present invention provide an elastic wave filter device that increases out-of-band attenuation at near a passband.

Preferred embodiments of the present invention also provide a duplexer that increases out-of-band attenuation at or near a passband of a transmission filter and improves isolation at a reception band.

An elastic wave filter device according to a preferred embodiment of the present invention includes a board and an elastic wave element chip mounted on the board.

In a preferred embodiment of the present invention, the elastic wave element chip defines a ladder filter including a plurality of series arm resonators arranged on a series arm connecting an input terminal and an output terminal and a plurality of parallel arm resonators arranged on respective parallel arms connecting the series arm and a ground potential. Further, a first inductor, a second inductor, and a shield electrode are provided in/on the board. The first inductor is connected in parallel to the at least one series arm resonator, the second inductor is connected between at least one of the parallel arm resonators and the ground potential, and the shield electrode is located between the first inductor and the second inductor.

In a certain aspect of the elastic wave filter device according to a preferred embodiment of the present invention, a ground terminal to be connected to the ground potential is located on the board, and the shield electrode is electrically connected to the ground terminal. This enables a further increase in the out-of-band attenuation since the shield electrode is connected to the ground potential.

In another certain aspect of the elastic wave filter device according to a preferred embodiment of the present invention, the shield electrode is electrically connected to an end portion of the parallel arm resonator that is to be connected to the ground potential. This makes it possible to share a common terminal for use as a terminal of the parallel arm resonator connected to the ground potential and as a portion of the shield electrode connected to the ground potential. Accordingly, the number of terminals configured to connect to the ground potential is reduced.

In still another certain aspect of the elastic wave filter device according to a preferred embodiment of the present invention, the first inductor and the second inductor are separated in a lateral direction in/on the board, and the shield electrode is disposed between the first inductor and the second inductor that are separated in the lateral direction. This suppresses the electromagnetic coupling between the first inductor and the second inductor with the shield electrode effectively.

In another certain aspect of the elastic wave filter device according to a preferred embodiment of the present invention, the first inductor and the second inductor are separated in a thickness direction of the board, and the shield electrode is disposed between the first inductor and the second inductor that are separated in the thickness direction. In this case, the first inductor and the second inductor are separated in the thickness direction. Thus, the planar shape of the elastic wave filter device is reduced.

In still another certain aspect of the elastic wave filter device according to a preferred embodiment of the present invention, the first inductor is connected in parallel to the series arm resonator that is closest to one of the input terminal and the output terminal, and, of the plurality of parallel arm resonators, the second inductor is connected to at least one parallel arm resonator that is closer to the other one of the input terminal and the output terminal. This makes it possible to keep the first inductor and the second inductor away from each other. Accordingly, the electromagnetic coupling is suppressed effectively.

In still another certain aspect of the elastic wave filter device according to a preferred embodiment of the present invention, a common end portion to connect to the ground potential is shared by the parallel arm resonators that are respectively provided on at least two parallel arms, and the second inductor is connected between the common end portion and the ground potential. This enables to reduce the inductance value of the second inductor that is connected to the parallel arm resonator. Therefore, a reduction in size is achieved. Further, the first inductor and the second inductor are kept away from each other. Accordingly, the electromagnetic coupling between the first inductor and the second inductor is suppressed effectively.

A duplexer according to a preferred embodiment of the present invention includes a first filter including the elastic wave filter device according to one of the preferred embodiments of the present invention and a second filter that has a passband different from that of the first filter. In the duplexer according to a preferred embodiment of the present invention, an electromagnetic coupling effect between the first inductor and the second inductor is suppressed in the first filter. Accordingly, the out-of-band attenuation in a vicinity of passband of the first filter is expanded, and the isolation characteristics in a passband of the second filter is improved.

Elastic wave filter devices according to various preferred embodiments of the present invention preferably include a shield electrode between the first inductor and the second inductor, which suppresses electromagnetic coupling between the first inductor and the second inductor, and thus expands the out-of-band attenuation at a vicinity of the passband of the elastic wave filter device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter the present invention is disclosed in detail by describing specific preferred embodiments of the present invention with reference to the drawings.

Figure 1:
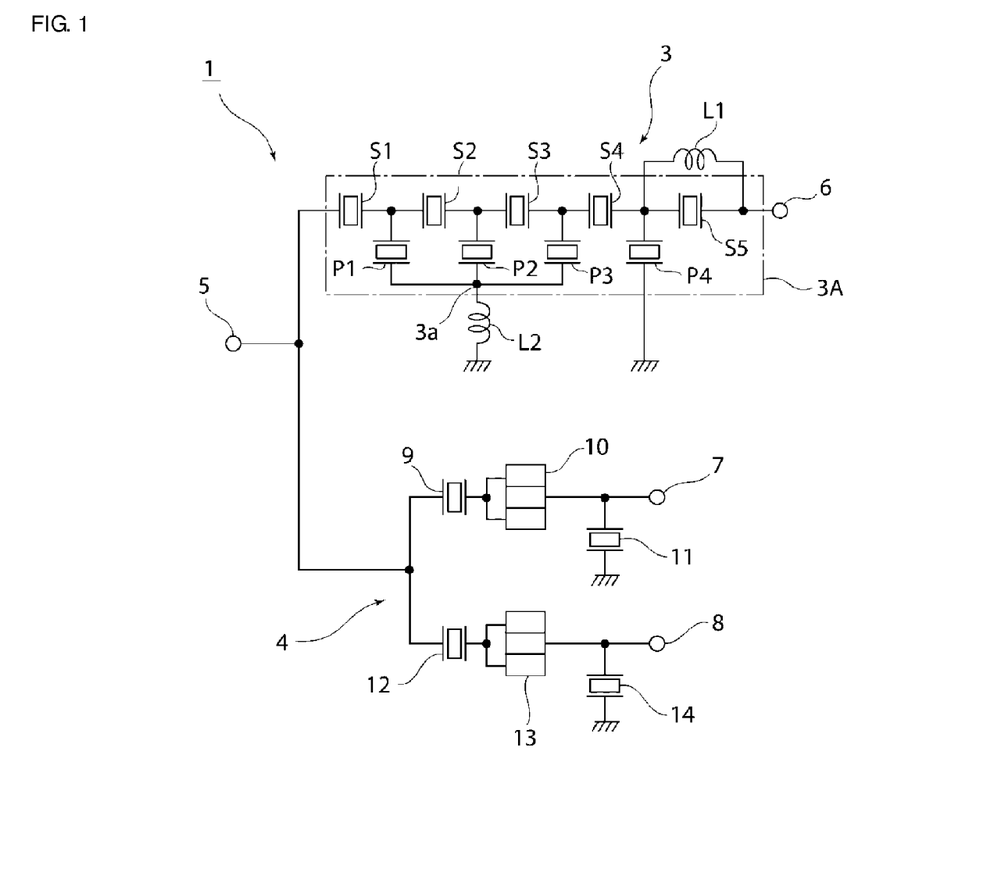
FIG. 1 is a circuit diagram of a duplexer including an elastic wave filter device according to a preferred embodiment of the present invention.

FIG. 1 is a circuit diagram of a duplexer including an elastic wave filter device according to a preferred embodiment of the present invention.

In a duplexer 1 of the present preferred embodiment, a transmission filter 3 is provided between an antenna terminal 5 and a transmitter terminal 6. A reception filter 4 is connected between the antenna terminal 5 and first and second receiver terminals 7, 8.

The transmission filter 3 includes an elastic wave filter element chip 3A having a ladder circuit configuration. In FIG. 1, a portion inside the elastic wave filter element chip 3A is surrounded by a dashed-dotted line. In other words, a plurality of series arm resonators S1 to S5 are connected in series to each other in a series arm connecting the antenna terminal 5 and the transmitter terminal 6. A plurality of parallel arms extends between the series arm and a ground potential. In other words, the parallel arms, each including one of parallel arm resonators P1, P2, P3, and P4, are provided.

The parallel arm resonators P1 to P3 are each connected to the series arm at one side and connected together at the other side. Here, a terminal at which the other sides of the parallel arm resonators are connected together is referred to as a common terminal 3a. A second inductor L2 is connected between the common terminal 3a and the ground potential. The parallel arm resonators P1 to P3 to which the second inductor L2 is connected is arranged on the other side of the transmitter terminal 6, namely, on the antenna terminal 5 side.

On the other hand, a bridging inductance, which is an inductance to be connected in parallel to a series arm resonator, is connected to the series arm resonator S5 that is the closest to the transmitter terminal 6. This bridging inductance is a first inductor L1.

In the transmission filter 3, an input terminal is the transmitter terminal 6, and an output terminal is an end portion at the antenna terminal 5 side. Thus, the first inductor L1 is arranged on the input terminal side. Further, the second inductor L2, which is connected to the parallel arm resonators P1 to P3, is arranged on the output terminal side.

The reception filter 4 is a balance-type elastic wave filter, and includes the antenna terminal 5 as an unbalanced terminal and the first and second receiver terminals 7, 8 as the first and second balanced terminals. A one-port type resonator 9 and a first longitudinally coupled resonator-type elastic wave filter portion 10 are connected between the antenna terminal 5 and the first receiver terminal 7. A resonator 11 is connected between the first longitudinally coupled resonator-type elastic wave filter portion 10 and the ground potential. Similarly, an one-port type elastic wave resonator 12 and a second longitudinally coupled resonator-type elastic wave filter portion 13 are connected between the antenna terminal 5 and the second receiver terminal 8. A resonator 14 is connected between the second longitudinally coupled resonator-type elastic wave filter portion 13 and the ground potential.

In the duplexer 1 of the present preferred embodiment, a passband of the transmission filter 3 preferably is about 1920 MHz to about 1980 MHz, and a passband of the reception filter 4 preferably is about 2110 MHz to about 2170 MHz, for example.

Here, the first inductor L1 and the second inductor L2 described above are provided in a board on which the elastic wave filter element chip 3A is mounted. This is now described with reference to FIGS. 2A, 2B, FIGS. 3A to 3C, and FIG. 4A.

Figure 2A:
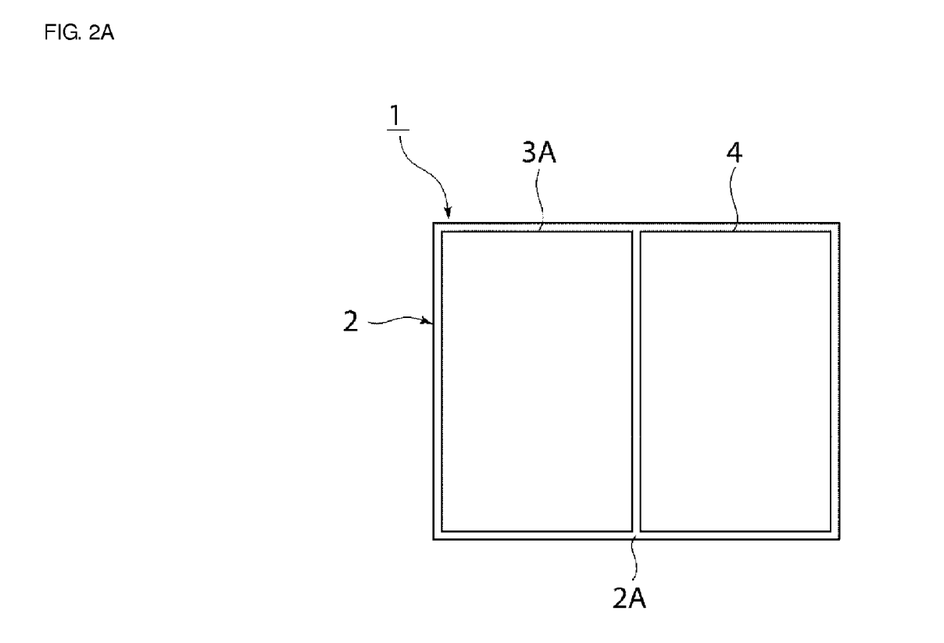
FIG. 2A and FIG. 2B are a plan view and a schematic front view of an elastic wave filter device according to a preferred embodiment of the present invention.
Figure 2B:
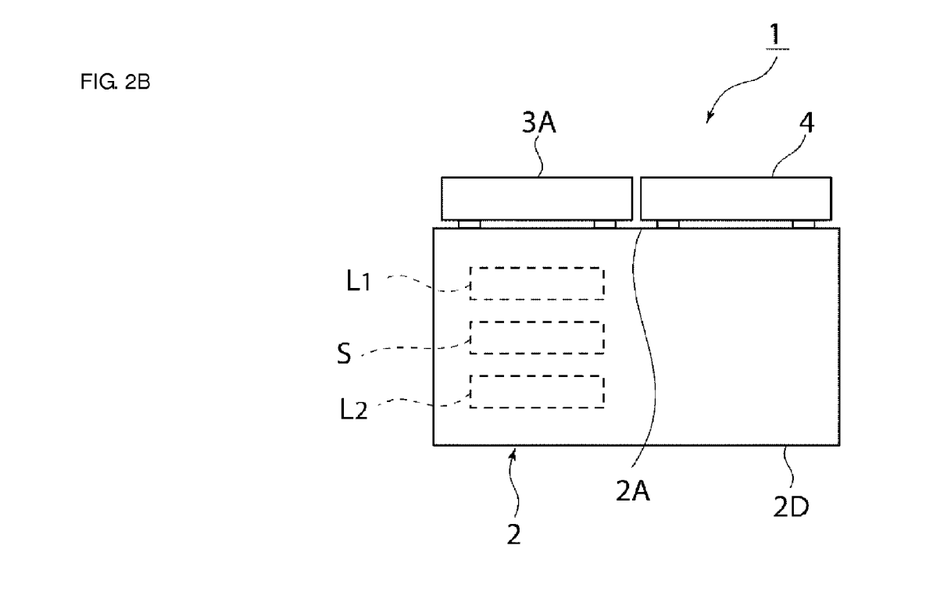

As illustrated in FIG. 2A and FIG. 2B, in the duplexer 1, the elastic wave filter element chip 3A and a chip that defines the reception filter 4 are mounted on a top surface of a board 2. On the other hand, the first inductor L1 and the second inductor L2 described above are provided in the board 2.

The board 2 preferably is a multilayer board including a stack of a plurality of insulation layers. FIGS. 3A to 3C and FIG. 4A are schematic plan views illustrating electrode configurations on a first layer 2A that is the top surface of the board 2, a second layer 2B arranged below the first layer 2A, a third layer 2C arranged below the second layer 2B, and a fourth layer 2D that is the bottom surface of the board 2. Here, in the viewing direction corresponding to the plan view of the top surface of the board 2, a direction from the top surface to the bottom surface is referred to as a downward direction whereas its opposite direction is referred to as an upward direction.

Figure 3A:
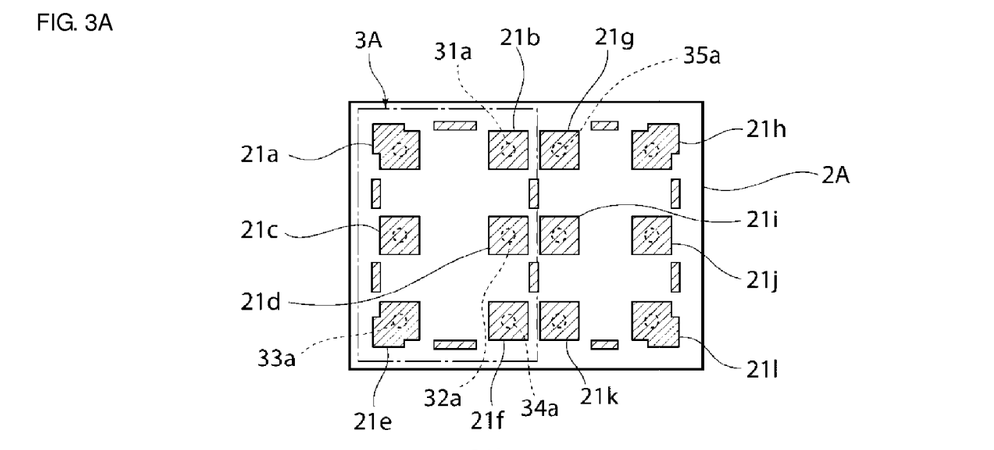
FIG. 3A to FIG. 3C are schematic plan views illustrating electrode configurations provided at first, second, and third layers of a board to be used in an elastic wave filter device according to a preferred embodiment of the present invention.

As illustrated in FIG. 3A, on the first layer 2A of the board 2, electrode lands 21a to 21f are provided in a region where the elastic wave filter element chip 3A outlined by the dashed-dotted line is mounted. Electrode lands 21g to 21l are provided in a region that is a remaining region of the first layer 2A of the board 2 excluding the region and at which the chip defining the reception filter 4 is mounted.

Further, a plurality of via-hole electrodes illustrated as dashed line circles in FIG. 3A are extended from the first layer 2A to another layer, the second layer 2B. For example, a via-hole electrode 31a extends downward from the bottom surface of an electrode land 21b. Similarly, a via-hole electrode 32a is extended toward the second layer 2B side from the bottom surface of an electrode land 21d. Further, a via-hole electrode 33a extends from the bottom surface of an electrode land 21e toward the second layer 2B side, and also a via-hole electrode 34a extends from the bottom surface of an electrode land 21f toward the second layer 2B side. A via-hole electrode 35a is extended toward the second layer 2B side from an electrode land 21g.

Figure 3B:
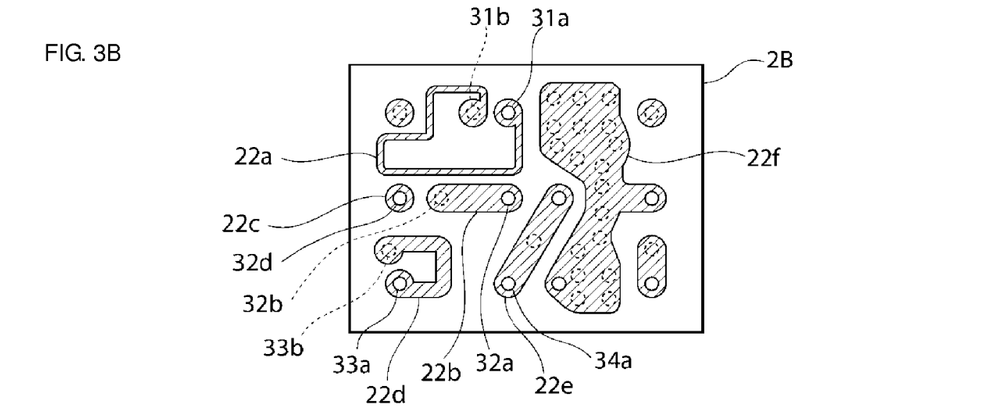

As illustrated in FIG. 3B, on the second layer 2B, a shield conductor portion 22a defining the first inductor, shield conductors 22b, 22c defining a shield electrode, and a shield conductor portion 22d defining the second inductor are provided below the region where the transmission filter chip is mounted. Further, connection conductor portions 22e, 22f are provided below the region where the reception filter is located.

In FIG. 3B, via-hole electrodes 31a, 32a, 32d, and 34a illustrated as solid line circles are extended from the first layer 2A toward the second layer 2B side as described above, and are connected at the respective bottom portions to electrodes of the shield conductor portion 22a, the shield conductor portion 22b, the shield conductor portion 22c, and the shield conductor portion 22d on the second layer 2B. Further, via-hole electrodes 31b, 32b, and 33b illustrated as dashed line circles in FIG. 3B are extended from the second layer 2B to the third layer 2C.

Figure 3C:
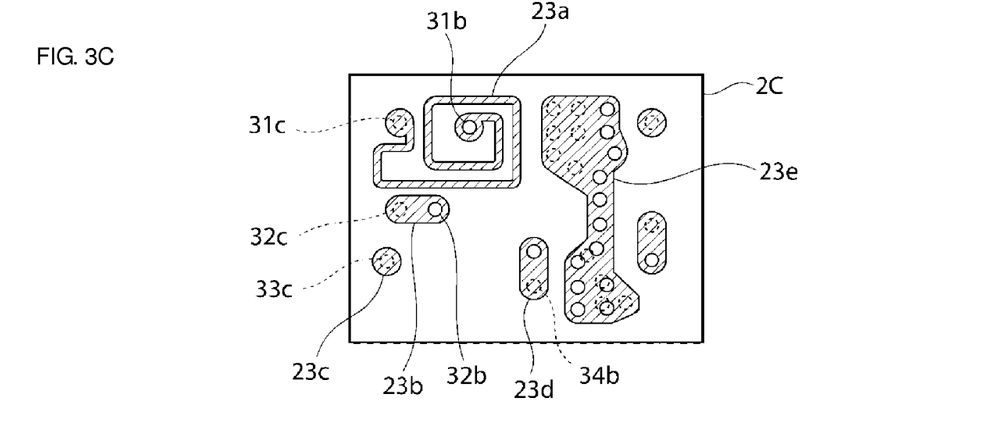

Similarly, as illustrated in FIG. 3C, a coil conductor portion 23a, a shield conductor portion 23b, and a connection conductor portion 23c are provided on the third layer 2C. Further, on the third layer 2C, a connection conductor portion 23d and a ground electrode 23e are provided below the region where the reception filter is located.

Similarly, on the third layer 2C, one end portion of the via-hole 31b is connected to near an end portion of the coil conductor portion 23a. The other end portion of the coil conductor portion 23a is electrically connected to a via-hole electrode 31c extending from the third layer 2C to the fourth layer 2D. Similarly, the via-hole 32b is connected to an end portion of the shield conductor portion 23b. The other end portion of the shield conductor portion 23b is connected to a via-hole electrode 32c extending from the third layer 2C to the fourth layer 2D. The connector conductor portion 23c is connected to a via-hole electrode 33c extending from the third layer 2C to the fourth layer 2D.

On the third layer 2C, the connection conductor portion 23d and the ground electrode 23e are provided below the reception filter formation region. The connection conductor portion 23d is connected to an upper end portion of a via-hole electrode 34b.

Figure 4A:
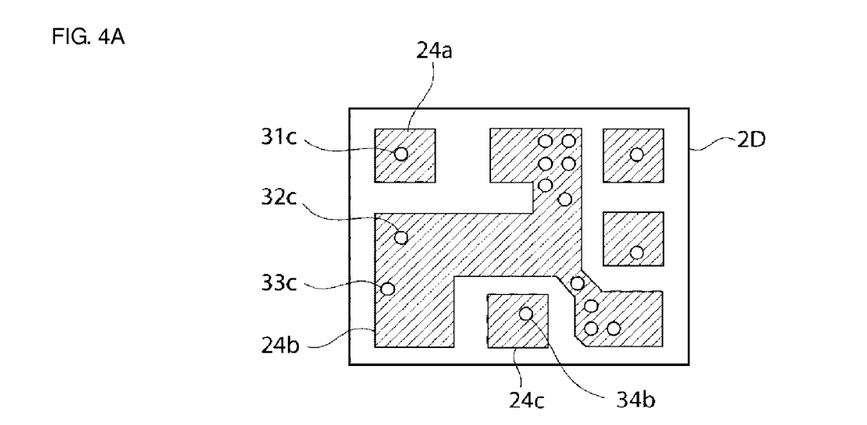
FIG. 4A is a schematic plan view illustrating an electrode configuration at a bottom layer of a board of an elastic wave filter device according to a preferred embodiment of the present invention.

As illustrated in FIG. 4A, electrode lands that define a transmitter terminal 24a, a ground terminal 24b, and an antenna terminal 24c are provided on the bottom surface of the board 2, namely, the fourth layer 2D. Here, a lower end portion of the via-hole electrode 31c is connected to the transmitter terminal 24a. The via-hole electrodes 32c, 33c are each connected to the ground terminal 24b. A lower end portion of the via-hole electrode 34b is connected to the antenna terminal 24c.

Figure 4B:
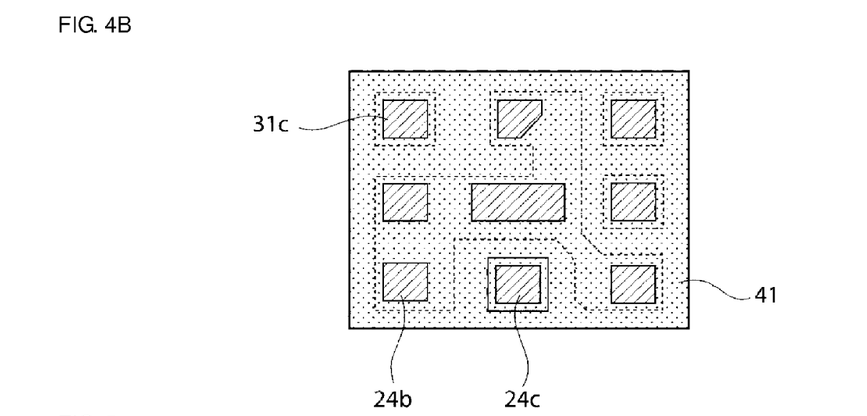
FIG. 4B is a schematic plan view illustrating a resist pattern provided on the bottom layer.

In practice, a resist 41 made of insulation material illustrated in FIG. 4B covers but also exposes portions of the antenna terminal 24c, the transmitter terminal 24a, and the ground terminal 24b described above. In this way, an undesirable short-circuit with an external electrode is reliably prevented.

In the elastic wave filter device according to the present preferred embodiment, the elastic wave filter element chip 3A is mounted on the board 2. Further, the first inductor L1 and the second inductor L2 described above are provided in the board 2. More specifically, the first inductor L1 is arranged along a line of the electrode land 21b-the via-hole electrode 31a-the shield conductor portion 22a-the via-hole electrode 31b-the coil conductor portion 23a-the via-hole electrode 31c-the transmitter terminal 24a.

On the other hand, the first inductor L1 and the second inductor L2 descried above are separated in a lateral direction inside the board 2. The second inductor L2 is arranged along a line of the electrode land 21e-the via-hole electrode 33a-the coil conductor portion 22d-the via-hole electrode 33b-the connection conductor portion 23c-the via-hole electrode 33c-the ground terminal 24b.

Further, the shield electrode is arranged between portions where the first inductor L1 and the second inductor L2 descried above are provided. This shield electrode preferably includes the electrode land 21d, the via-hole electrode 32a, the shield conductor portion 22b, the via-hole electrode 32b, the shield conductor portion 23b, and the via-hole electrode 32c. In other words, the shield electrode is provided between the first inductor and the second inductor that are separated in an up-and-down direction.

Thus, the present preferred embodiment enable to suppress the electromagnetic coupling between the first inductor L1 defining a bridging inductor layer and the second inductor L2 connected to the parallel arm resonators effectively with the shield electrode. This enables to expand the out-of-band attenuation at near the passband of the transmission filter 3, as clearly indicated by experiment examples, which will be described below. Further, improves the isolation in the reception band in the duplexer 1.

In particular, in the present preferred embodiment, one end portion of the shield electrode is connected to the ground terminal 24b that is connected to the ground potential. In other words, the shield electrode is connected to the ground potential. Thus, the electromagnetic coupling suppressing effect by the shield electrode is promoted further. However, the shield electrode may alternatively be formed as a floating electrode without connecting to the ground potential.

Further, in the present preferred embodiment, as described above, the first inductor L1 and the second inductor L2 are separated in the lateral direction inside the board 2. Alternatively, as illustrated in FIG. 2B with dashed line, the first inductor L1 and the second inductor L2 are separated in a thickness direction inside the board 2. In that case, a shield electrode S illustrated with dashed line preferably are arranged between the first inductor L1 and the second inductor L2, which are also illustrated with dashed line. Here, the thickness direction of the board 2 is a viewing direction corresponding to the plan view of the top surface of the board 2.

Further, in the present preferred embodiment, the first inductor L1 is connected to the series arm resonator S5 that is the closest to the transmitter terminal side, and the second inductor L2 is connected to the parallel arm resonators P1 to P3 that are arranged on the antenna terminal 5 side. Here, the antenna terminal 5 defines and serves as the output terminal. Thus, the first inductor L1 and the second inductor L2 are kept away easily. This also makes it possible to suppress the electromagnetic coupling effectively. However, connecting positions of the first inductor L1 and the second inductor L2 that is connected to the parallel arm resonators are not limited to the configuration illustrated in FIG. 1.

Further, in the present preferred embodiment, the second inductor L2 is electrically connected to the common terminal 3a that is a common end portion shared by the plural parallel arm resonators P1 to P3 to connect the ground potential. Thus, the inductance value required for the second inductor L2 is reduced, and the second inductor L2 is reduced in size. Accordingly, this also makes it possible to keep the first inductor L1 and the second inductor L2 away from each other, thus suppressing the electromagnetic coupling more effectively.

Alternatively, a second inductor may be connected to the plural parallel arm resonators each. Various preferred embodiments of the present invention may be applied to a configuration in which the second inductor L2 is connected between the ground potential and at least one parallel arm resonator of the plurality of parallel arm resonators.

Similarly, the first inductor L1 forming the bridging inductor may not be necessarily connected to the series arm resonator S5, and may alternatively be connected in parallel to another series arm resonator. Various preferred embodiments of the present invention may be widely applied to elastic wave filter devices in which a bridging inductor is connected in parallel to at least one series arm resonator.

Further, in the present preferred embodiment, the shield electrode including the shield conductor portions 22b, 22c, and 23b is connected to the ground terminal 24b in the board 2, and the terminal of the parallel arm resonator to connect to the ground potential is also electrically connected to the ground terminal 24b. Accordingly, this allows sharing the ground terminal 24b as the end portion of the parallel arm resonator to connect to the ground potential and as the end portion of the shield electrode to connect to the ground potential. Thus, the number of terminals to be connected to the ground potential is reduced.

Further, in the duplexer 1, the configuration of the transmission filter 3 and the configuration for connecting the terminals located on the bottom surface of the board 2 of the reception filter 4 are not limited to structures of the present preferred embodiment.

Figure 5:
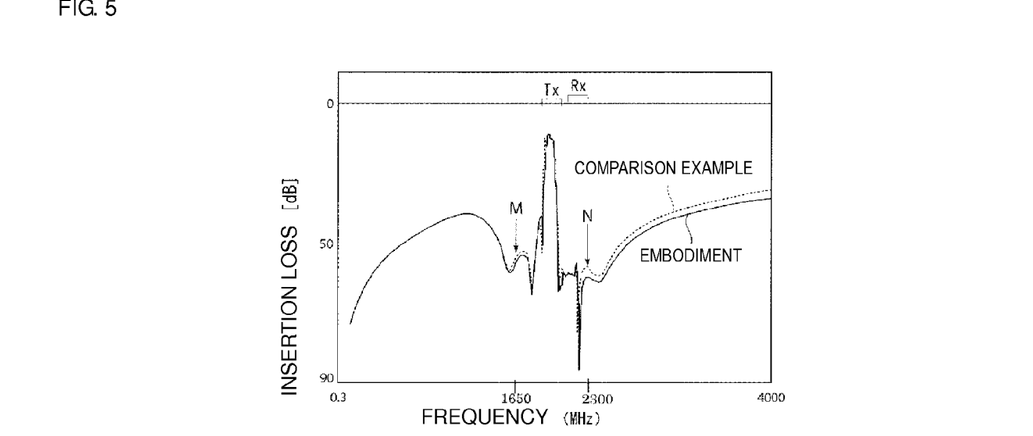
FIG. 5 is a diagram illustrating attenuation frequency characteristics of an elastic wave filter device according to a preferred embodiment of the present invention and an elastic wave filter device of a comparison example.

A solid line of FIG. 5 is a diagram illustrating attenuation frequency characteristics of the transmission filter 3 of the duplexer 1 according to the present preferred embodiment, where the horizontal axis represents frequency [MHz] and the vertical axis represents insertion loss [dB]. A dashed line of FIG. 5 is a diagram illustrating the attenuation frequency characteristics of a transmission filter of duplexer, which is configured as is the case with the present preferred embodiment except that the shield electrode is not formed therein. As is evident from FIG. 5, compared with a comparison example, the present preferred embodiment enables to largely increase the attenuation outside the passband of transmission band Tx. The out-of-passband attenuation is about 2 dB at a lower band side vicinity of 1650 MHz, which is marked with an arrow M. The out-of-passband attenuation is about 3 dB at a higher band side vicinity of 2300 MHz, which is marked with an arrow N.

Figure 6:
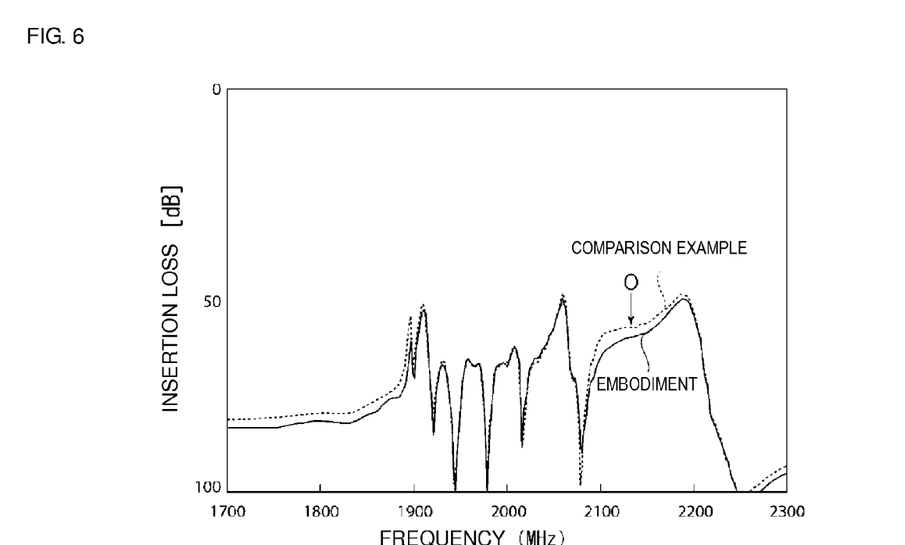
FIG. 6 is a diagram illustrating isolation characteristics of duplexers according to a preferred embodiment of the present invention and a comparison example.

Further, FIG. 6 is a diagram illustrating isolation characteristics of duplexers according to the present preferred embodiment and the comparison example, where the horizontal axis represents frequency [MHz] and the vertical axis represents insertion loss [dB]. A solid line indicates a result of the present preferred embodiment whereas a dashed line indicates a result of the comparison example. As is evident from FIG. 6, the isolation in the reception band Rx marked with an arrow O is largely improved according to the present preferred embodiment compared with the comparison example.

Thus, it is clear that preferred embodiments of the preferred embodiment expand the out-of-band attenuation at vicinities of the transmission band and improve the isolation in the reception band because the electromagnetic coupling between the first inductor and the second inductor described above is effectively suppressed by the shield electrode.

Figure 7:
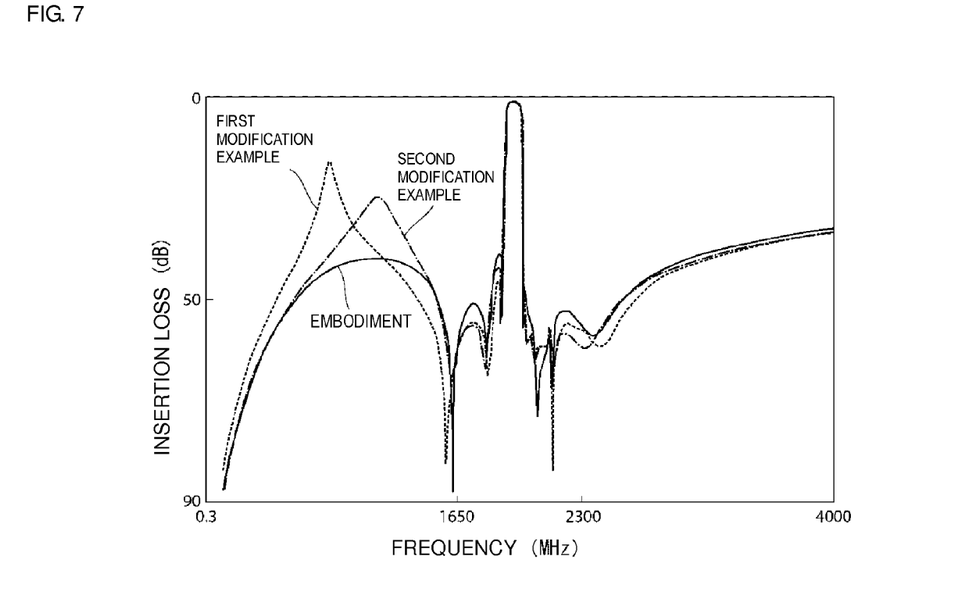
FIG. 7 is a diagram illustrating attenuation frequency characteristics of elastic wave filter devices according to a preferred embodiment of the present invention and a first modification example and a second modification example of a preferred embodiment of the preset invention.

FIG. 7 is a diagram illustrating the attenuation frequency characteristics of the transmission filter 3 of the duplexer 1 in the present preferred embodiment, a first modification example, and a second modification example, where the horizontal axis represents the frequency [MHz] and the vertical axis represents the insertion loss [dB]. In the first modification example, the inductor L1 is connected to the series arm resonator S1 that is the closest to the antenna terminal side. In the second modification example, the inductor L1 is connected to the series arm resonator S4 that is arranged in between the antenna terminal and the input terminal. A solid line in FIG. 7 indicates the attenuation frequency characteristics of the transmission filter of the duplexer in the present preferred embodiment, in which the inductor L1 is connected to the series arm resonator S5. A dashed line indicates the attenuation frequency characteristics of the transmission filter in the first modification example, in which the inductor L1 is connected to the series arm resonator S1 instead of the series arm resonator S5. A dashed-dotted line indicates the attenuation frequency characteristics of the transmission filter in the second modification example, in which the inductor L1 is connected to the series arm resonator S4 instead of the series arm resonator S5.

As is evident from FIG. 7, the first modification example and the second modification example largely increase the attenuation outside the passband of transmission band Tx, as is the configuration of the present preferred embodiment where the inductor L1 is connected to the series arm resonator S5. The out-of-passband attenuation is about 2-3 dB at the lower band side vicinity of 1650 MHz and the higher band side vicinity of 2300 MHz.

However, the present preferred embodiment is more preferable, for it has a larger lower frequency side attenuation at 1000 MHz that is the passband of transmission band Tx, compared with the cases of the first modification example and the second modification example.

Each elastic wave resonator for use in achieving the ladder circuit configuration in the elastic wave filter device according to a preferred embodiment of the present invention may be defined by a different elastic wave resonator such as a surface acoustic wave resonator, a boundary acoustic wave resonator, or the like. Further, the first inductor and the second inductor described above are not limited to ones of FIG. 1 including the coil conductor portions as long as they can be provided in/on the board 2. Further, a magnetic layer may be provided at a portion of the board 2 so as to define at least one of the first inductor and the second inductor in the board 2.

Further, in the present preferred embodiment, a preferred embodiment applied to the transmission filter of the duplexer 1 is described. However, it should be noted that the elastic wave filter device according to various preferred embodiments of the present invention may be widely applicable to various elastic wave filter devices in which elastic wave filter element chips are mounted on boards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
   a board; and
   an elastic wave element chip mounted on the board; wherein
   the elastic wave element chip defines a ladder filter including a plurality of series arm resonators arranged on a series arm connecting an input terminal and an output terminal and a plurality of parallel arm resonators arranged on respective parallel arms connecting the series arm and a ground potential; and
   a first inductor, a second inductor, and a shield electrode are provided in/on the board, the first inductor being connected in parallel to the at least one series arm resonator, the second inductor being connected between at least one of the parallel arm resonators and the ground potential, the shield electrode being located between the first inductor and the second inductor.

2. The elastic wave filter device according to claim 1, wherein a ground terminal to be connected to the ground potential is located on the board, and the shield electrode is electrically connected to the ground terminal.

3. The elastic wave filter device according to claim 1, wherein the shield electrode is electrically connected to an end portion of the parallel arm resonator that is to be connected to the ground potential.

4. The elastic wave filter device according to claim 1, wherein the first inductor and the second inductor are separated in a lateral direction in/on the board, and the shield electrode is disposed between the first inductor and the second inductor that are separated in the lateral direction.

5. The elastic wave filter device according to claim 1, wherein the first inductor and the second inductor are separated in a thickness direction of the board, and the shield electrode is disposed between the first inductor and the second inductor that are separated in the thickness direction.

6. The elastic wave filter device according to claim 1, wherein
   the first inductor is connected in parallel to the series arm resonator that is closest to one of the input terminal and the output terminal; and
   the second inductor is connected to at least one of the plurality of parallel arm resonators that is closer to another one of the input terminal and the output terminal.

7. The elastic wave filter device according to claim 1, wherein a common end portion configured to connect to the ground potential is shared by the parallel arm resonators that are respectively provided on at least two parallel arms, and the second inductor is connected between the common end portion and the ground potential.

8. A duplexer comprising:
   a first filter including the elastic wave filter device according to claim 1; and
   a second filter that has a passband different from that of the first filter.

9. The duplexer according to claim 8, wherein a ground terminal to be connected to the ground potential is located on the board, and the shield electrode is electrically connected to the ground terminal.

10. The duplexer according to claim 8, wherein the shield electrode is electrically connected to an end portion of the parallel arm resonator that is to be connected to the ground potential.

11. The duplexer according to claim 8, wherein the first inductor and the second inductor are separated in a lateral direction in/on the board, and the shield electrode is disposed between the first inductor and the second inductor that are separated in the lateral direction.

12. The duplexer according to claim 8, wherein the first inductor and the second inductor are separated in a thickness direction of the board, and the shield electrode is disposed between the first inductor and the second inductor that are separated in the thickness direction.

13. The duplexer according to claim 8, wherein
   the first inductor is connected in parallel to the series arm resonator that is closest to one of the input terminal and the output terminal; and
   the second inductor is connected to at least one of the plurality of parallel arm resonators that is closer to another one of the input terminal and the output terminal.

14. The duplexer according to claim 8, wherein a common end portion configured to connect to the ground potential is shared by the parallel arm resonators that are respectively provided on at least two parallel arms, and the second inductor is connected between the common end portion and the ground potential.

* * * * *